United States Patent
Takano

(10) Patent No.: US 8,520,460 B2
(45) Date of Patent: Aug. 27, 2013

(54) SEMICONDUCTOR MEMORY DEVICE AND ACCESS METHOD

(75) Inventor: Susumu Takano, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 205 days.

(21) Appl. No.: 12/801,860

(22) Filed: Jun. 29, 2010

(65) Prior Publication Data

US 2011/0007593 A1    Jan. 13, 2011

(30) Foreign Application Priority Data

Jul. 10, 2009 (JP) ................. 2009-164242

(51) Int. Cl.
  *G11C 7/00*  (2006.01)
(52) U.S. Cl.
  USPC ...................... 365/222; 365/230.03
(58) Field of Classification Search
  None
  See application file for complete search history.

(56) References Cited

U.S. PATENT DOCUMENTS

| 5,386,385 A * | 1/1995 | Stephens, Jr. ............ 365/189.05 |
| 2005/0105380 A1 | 5/2005 | Takahashi et al. |
| 2005/0169091 A1* | 8/2005 | Miki et al. ............... 365/230.03 |
| 2007/0195627 A1 | 8/2007 | Kim |
| 2008/0137464 A1 | 6/2008 | Kim |
| 2008/0225619 A1* | 9/2008 | Kawabata ..................... 365/222 |
| 2011/0051528 A1 | 3/2011 | Kim |

FOREIGN PATENT DOCUMENTS

| JP | 2002-025254 (A) | 1/2002 |
| JP | 2003-016781(A) | 1/2003 |
| JP | 2005-149590 | 6/2005 |
| JP | 2006-190404 | 7/2006 |
| JP | 2007-226934 (A) | 9/2007 |

OTHER PUBLICATIONS

NEC Electronics Co., Ltd., "User's Manual; How to use Low Latency DRAM", Apr. 2008.
NEC Electronics Co., Ltd., "Data Sheet; MOS Integrated Circuit μD48288209, 48288218, 48288236; 288M-BIT Low Latency DRAM Common I/O", Jan. 2009.
Japanese Notification of Reasons for Refusal dated Apr. 5, 2013, with English-language translation.

* cited by examiner

*Primary Examiner* — Hoai V Ho
*Assistant Examiner* — James G Norman
(74) *Attorney, Agent, or Firm* — McGinn IP Law Group, PLLC

(57) ABSTRACT

A semiconductor memory device includes a memory comprising a plurality of banks; an input section configured to input an address of a bank address, a row address and a column address; and a command generating circuit configured to issue one of a read command, a write command, and a refresh command based on to an input signal. A control section selects a selection bank from the plurality of banks based on the bank address when the read command or the write command is issued from the command generating circuit, performs a read operation or a write operation on the selection bank based on the row address and the column address, and performs a refresh operation on the selection bank when the refresh command is issued immediately after the read command or the write command.

16 Claims, 14 Drawing Sheets

Fig. 2 CONVENTIONAL ART

| Command | /CS | /WE | /REF | Add(20) | BA(3) | COMMENT |
|---|---|---|---|---|---|---|
| NOP | 1 | × | × | × | × | No Operation |
| READ | 0 | 1 | 1 | RA, CA | BA | Read |
| WRITE | 0 | 0 | 1 | RA, CA | BA | Write |
| REFRESH | 0 | 1 | 0 | × | BA | INPUT ONLY BANK ADDRESS |
| MRS | 0 | 0 | 0 | CODE | × | MODE SETTING |

BA: BANK ADDRESS
RA: ROW ADDRESS
CA: COLUMN ADDRESS

| EXTERNAL PIN | A19 | A18 | A17 | A16 | A15 | A14 | A13 | A12 | A11 | A10 | A9 | A8 |
|---|---|---|---|---|---|---|---|---|---|---|---|---|
| INTERNAL ADDRESS | RA11 | RA10 | RA9 | RA8 | RA7 | RA6 | RA5 | RA4 | RA3 | RA2 | RA1 | RA0 |
| EXTERNAL PIN | A7 | A6 | A5 | A4 | A3 | A2 | A1 | A0 | | | | |
| INTERNAL ADDRESS | CA7 | CA6 | CA5 | CA4 | CA3 | CA2 | CA1 | CA0 | | | | |

| EXTERNAL PIN | B2 | B1 | B0 |
|---|---|---|---|
| INTERNAL ADDRESS | BA2 | BA1 | BA0 |

BAa: BANK ADDRESS
RAx: ROW ADDRESS
CAy: COLUMN ADDRESS

Fig. 5

| Command | /CS | /WE | /REF | A(6) Beat1-4 | COMMENT |
|---|---|---|---|---|---|
| NOP | 1 | × | × | × | No Operation |
| READ | 0 | 1 | 1 | BA/RA/CA | Read |
| WRITE | 0 | 0 | 1 | BA/RA/CA | Write |
| REFRESH | 0 | 1 | 0 | BA | REFLECT BAND ADDRESS FOR ONE CLOCK |
| MRS | 0 | 0 | 0 | CODE | MODE SETTING |

BA: BANK ADDRESS
RA: ROW ADDRESS
CA: COLUMN ADDRESS

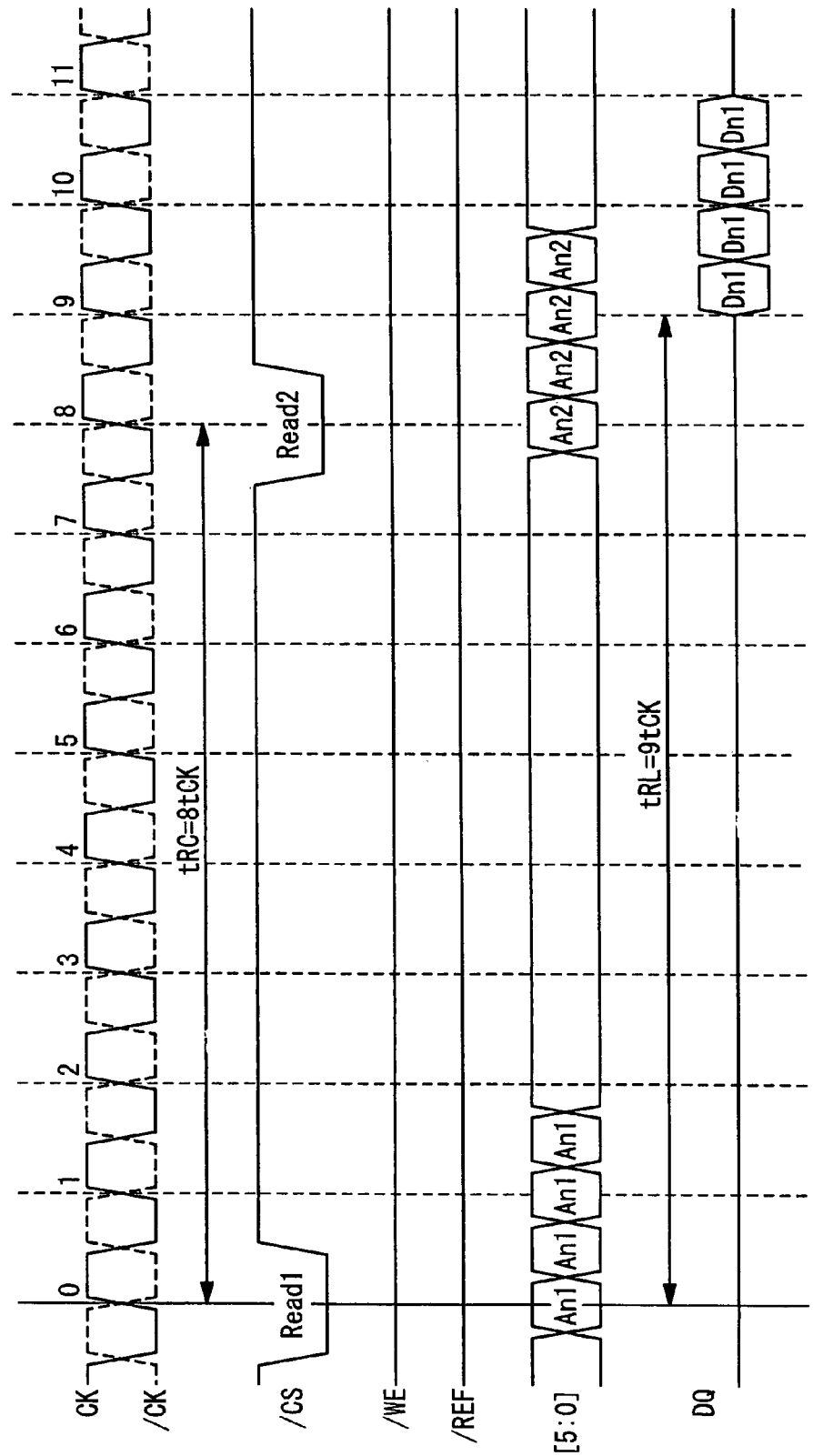

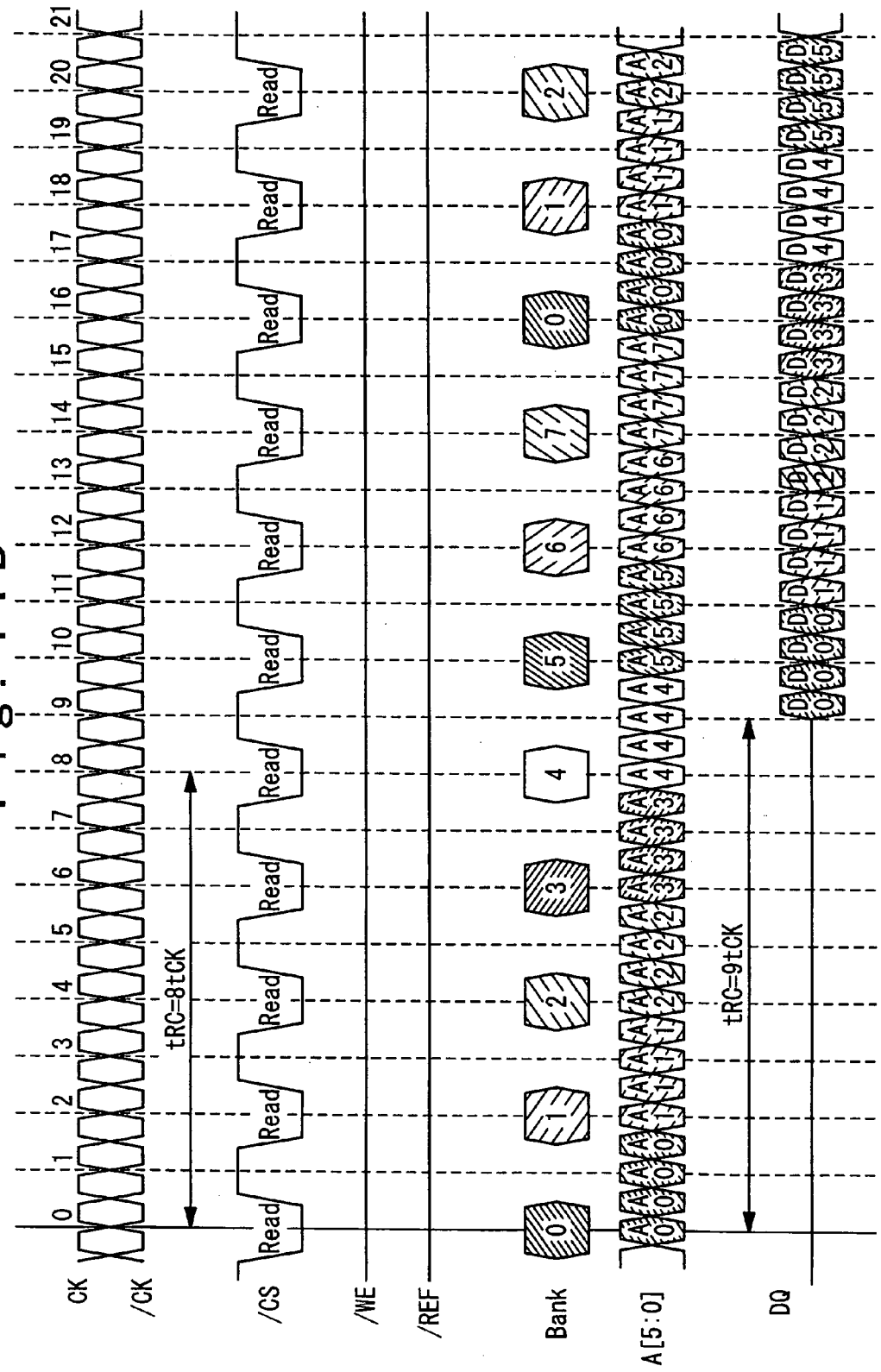

SEMICONDUCTOR MEMORY DEVICE AND ACCESS METHOD

INCORPORATION BY REFERENCE

This patent application claims a priority on the convention based on Japanese Patent Application No. 2009-164242 filed on Jul. 10, 2009. The disclosure thereof is incorporated herein by reference.

TECHNICAL FIELD

The present invention relates to a semiconductor memory device requiring a refresh operation.

BACKGROUND ART

The frequency of a clock signal used in data transfer between a memory and a CPU (Central Processing Unit) increases year by year. For this reason, it has become more difficult to realize high-quality data transfer in a high frequency operation.

Meanwhile, various specifications and operation modes are considered in order to improve bus efficiency. However, an obstacle thereof is a refresh operation. A frequency of the refresh operation tends to increase in accordance with increase of a memory capacity and development of a fine process, and accordingly it becomes important to suppress lowering of the bus efficiency caused by the refresh operation.

As a high-speed operating DRAM (Dynamic Random Access Memory) operating in synchronization with a clock signal, an SDRAM (Synchronous Dynamic Random Access Memory) and a GDDR (Graphics Double Data Rate) are generally known. To carry out a read operation and a write operation, at first, an "IDLE" state is transited to an "ACTIVE" state in response to an active command and a row address. When a read command or a write command and a column address are further supplied in this state, a sequential read operation or write operation can be performed by a multi-bank accessing operation. The high bus efficiency can be retained in this state.

Meanwhile, in a pseudo SRAM which does not have an auto-refresh command, since the refresh operation is hidden in a latency of the read or write, the lowering of the bus efficiency caused by the refresh operation can be eliminated.

A semiconductor memory device described in Patent Literature 1 has a plurality of banks including memory cell arrays where dynamic type memory cells (the pseudo SRAM) are arranged in a matrix. The semiconductor memory device includes an address counter for outputting a series of addresses including an address supplied from outside as a first address in sequence for every period of a clock signal from the outside; an access control circuit for executing a read access, a write access, and a refreshing access; and a refreshing access control circuit for controlling the access control circuit to execute the refreshing access. An outputted address from the address counter is set as a row address used for selecting a word line in the memory cell array, a column address used for selecting a bit line in the memory cell array, and a bank address used for selecting the bank. In a burst operation, the read access or the write access is continuously executed in accordance with the series of addresses to the plurality of memory cells existing over the plurality of banks. In this case, in a case of executing the read access, the refreshing access control circuit permits the access control circuit to execute the refreshing access to the bank to which the read access has been performed in accordance with timing at which a bank address is changed, after the access control circuit performed the read access to the bank corresponding to the changed bank address.

In a semiconductor memory device described in Patent Literature 2, a part of address terminals serves as a common terminal shared with a data terminal for outputting and/or inputting. A part or all of the remaining address terminals serve as an address-dedicated terminal for accessing in a page. In the semiconductor memory device, to a page selected based on an address from the common terminal, sequential outputting and/or inputting of plural pieces of data in a page is performed through the common terminal on the basis of an address signal inputted to the address-dedicated terminal.

CITATION LIST

Patent Literature 1: JP 2006-190404A
Patent Literature 2: JP 2005-149590A
Non-patent Literature 1: NEC ELECTRONICS Co., Ltd., "User's Manual; How to use Low Latency DRAM", April, 2008
Non patent Literature 2: NEC ELECTRONICS Co., Ltd., "DATA SHEET; MOS INTEGRATED CIRCUIT µPD48288209, 48288218, 48288236; 288M-BIT Low Latency DRAM Common I/O", January, 2009

SUMMARY

An SDRAM operating in synchronization with a clock signal can carry out a sequential operation of a read operation or a write operation in an "ACTIVE" state. However, it is required to input a refresh command after stopping a continuous read or write operation in order to perform a required refresh operation within a certain period. For this purpose, a state firstly returns from an "ACTIVE" state to an "IDLE" state and then the refresh command is inputted in the state. Thus, the read operation or the write operation is stopped and a blank occurs in the bus transfer.

In the pseudo SRAM, the lowering of bus efficiency caused by the refresh operation is eliminated because the refresh operation is hidden in a latency of the read or write. However, a time for the refresh operation and the read operation is required in a time for accessing. For this reason, an access speed and a characteristic of an operation cycle degrade.

Considering these tendencies, it can be found that there are some problems for the purpose of maximizing the bus efficiency of a large-capacity memory to realize a high-frequency operation DRAM while maintaining high quality with the specifications of the present SDRAM and the pseudo SDRAM.

In an aspect of the present invention, a semiconductor memory device includes: a memory comprising a plurality of banks; an input section configured to input an address of a bank address, a row address and a column address; a command generating circuit configured to issue one of a read command, a write command, and a refresh command based on to an input signal; and a control section configured to select a selection bank from the plurality of banks based on the bank address when the read command or the write command is issued from the command generating circuit, perform a read operation or a write operation on the selection bank based on the row address and the column address, and perform a refresh operation on the selection bank when the refresh command is issued immediately after the read command or the write command.

In another aspect of the present invention, a memory access method to a memory having a plurality of banks, is achieved by inputting a bank address, a row address and a column address; by issuing any of a read command, a write command, and a refresh command based on an input signal; by selecting a selection bank from the plurality of banks based on the bank address, when the read command or a write command is issued; by performing a read operation or a write operation on the selection bank based on the row address and the column address in response to the read command or the write command; and by performing a refresh operation on the selection bank when the refresh command is issued immediately after the read command or the write command.

When a refresh command is issued, a refresh operation is performed after temporarily interrupting a read operation or a write operation, and accordingly deterioration of a bus efficiency caused by the refresh operation is cited as one factor that makes it difficult to realize high-quality data transfer in a high frequency operation. Thus, according to the semiconductor memory device of the present invention, the refresh command is executed to a bank specified when a latest reading command or writing command has been issued. For this reason, the refresh command can be issued, maintaining the read operation or the write operation. In this manner, the deterioration of the bus efficiency caused by the refresh operation can be prevented. Accordingly, the high-quality data transfer can be realized in the high frequency operation.

BRIEF DESCRIPTION OF THE DRAWINGS

The above and other objects, advantages and features of the present invention will be more apparent from the following description of certain embodiments taken in conjunction with the accompanying drawings, in which:

FIG. 2 is a command truth-value table showing an operation of the conventional semiconductor memory device;

FIG. 5 is a command truth-value table showing an operation of the semiconductor memory device according to the embodiment of the present invention;

FIG. 11A is a diagram showing timing charts in a single-bank read operation as an operation of the semiconductor memory device according to the embodiment of the present invention;

FIG. 11B is a diagram showing timing charts in the multi-bank read operation as the operation of the semiconductor memory device according to the embodiment of the present invention;

DESCRIPTION OF THE PREFERRED EMBODIMENTS

Hereinafter, a semiconductor memory device according to the present invention will be described in detail while comparing with the conventional device, with reference to the attached drawings.

Figure 1:
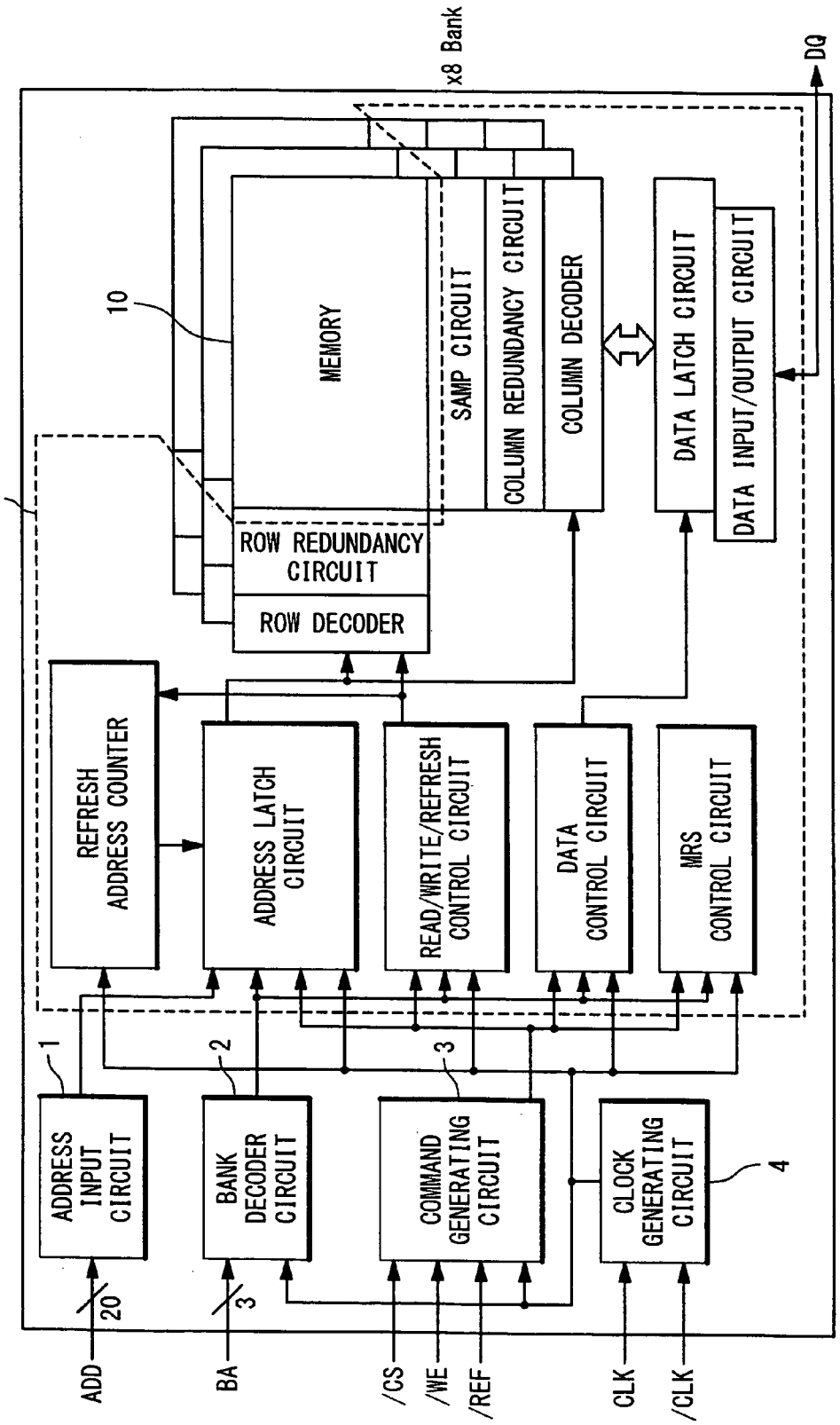
FIG. 1 is a block diagram showing a configuration of a conventional semiconductor memory device shown in Non-patent Literatures 1 and 2.

FIG. 1 is a block diagram showing a configuration of the conventional semiconductor memory device shown in the Non-patent literature 1 and Non-patent literature 2.

The conventional semiconductor memory device is a DRAM (a pseudo SRAM) of 1 G bits and includes an address input circuit 1, a bank decoder circuit 2, a command generating circuit 3, a clock generating circuit 4, a control section 5, a memory 10 with 1 G bits and 32 IOs.

The control section 5 includes a refresh address counter, an address latch circuit, a read/write/refresh control circuit, a data control circuit, an MRS control circuit, a data input/output circuit, a data latch circuit, a row decoder, a column decoder, and a sense amplifier (SAMP) circuit. The configurations and operations of these components are well known to a person in the art, and do not related directly to the present invention. Therefore, the description thereof will be omitted.

The memory 10 has P banks, and is designed to operate based on Q bursts (P and Q are integers equal to or more than 8 and 4, respectively). For example, it is assumed that P and Q are 8 and 4, respectively. In each of the 8 banks, memory cells are provided in a matrix. A plurality of word lines are connected to rows of each of the banks, respectively. A plurality of bit lines are connected to columns of each bank, respectively.

The clock generating circuit 4 generates an internal clock signal in accordance with clock signals CLK and /CLK, and outputs the generated internal clock signal to the bank decoder circuit 2, the command generating circuit 3, and the control section 5.

An input signal /CS, an input signal /WE, and an input signal /REF are supplied to the command generating circuit 3. As commands, there are five types of commands that are a NOP (No Operation) command, a READ (read) command, a WRITE (write) command, a REFRESH (refresh) command, and a MRS (Mode Resister Set) command. The command generating circuit 3 issues (generates and produces) a command representing any one of the NOP command, the read command, the write command, the refresh command, and the MRS command on the basis of a combination of the input signals /CS, /WE, and /REF.

FIG. 2 is a command truth-value table showing an operation of the conventional semiconductor memory device. For example, when signal levels of the input signals /CS, /WE, and /REF are 1, undefined (×), and undefined, respectively, the command generating circuit 3 issues the NOP command. In this case, the command generating circuit 3 outputs the command to the control section 5 in synchronization with the internal clock signal.

For example, when the signal levels of the input signals /CS, /WE, and /REF are 0, 1, and 1, respectively, the command generating circuit 3 issues the read command. In this case, the command generating circuit 3 outputs the read command to the control section 5 in accordance with the internal clock signal. For example, when the signal levels of the input signals /CS, /WE, and /REF are 0, 0, and 1, respectively, the command generating circuit 3 issues the write command. In this case, the command generating circuit 3 outputs the write command to the control section 5 in accordance with the internal clock signal. For example, when the signal levels of the input signals /CS, /WE, and /REF are 0, 1, and 0, respectively, the command generating circuit 3 issues the refresh command. In this case, the command generating circuit 3 outputs the refresh command to the control section 5 in accordance with the internal clock signal. For example, when the signal levels of the input signals /CS, /WE, and /REF are 0, 0, and 0, respectively, the command generating circuit 3 issues the MRS command. In this case, the command generating circuit 3 outputs the MRS command to the control section 5 in accordance with the internal clock signal.

The address input circuit 1 inputs an address ADD, and outputs the address ADD to the control section 5. The address signal ADD includes a row address RA and column address CA.

The bank decoder circuit 2 inputs a bank address BA, and outputs the bank address BA to the control section 5 in synchronization with the internal clock signal. The bank address BA represents one bank of eight banks.

It is assumed that the bank address is L bits; the row address is M bits; and the column address is N bits. For example, it is assumed that L, M, and N are 3, 12, and 8, respectively. In this case, the address input circuit 1 is connected to twenty external pins for inputting the address ADD (the row address RA and the column address CA). The bank decoder circuit 2 is connected to three external pins for inputting the bank address BA.

Figure 3:
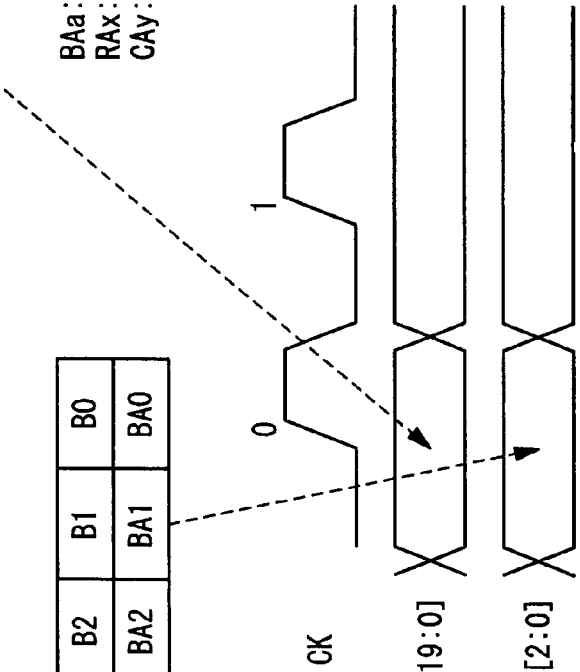
FIG. 3 shows allocation of address pins in the conventional semiconductor memory device.

FIG. 3 shows allocation of the external pins in the conventional semiconductor memory device. For example, it is assumed that $8^{th}$ to $19^{th}$ bits of the row address RA are bits RA0 to RA11 respectively, and that $0^{th}$ to $7^{th}$ bits of the column address CA are bits CA0 to CA7, respectively. In this case, the bits CA0 to CA7 of the column address CA and the bits RA0 to RA11 of the row address are allocated to the external pins A0 to A19, respectively. It is assumed that 0th to 2nd bits of the bank address BA are bits BA0 to BA2. In this case, the bits BA0 to BA2 of the bank address BA are allocated to the external pins B0 to B2.

Here, the address input circuit 1 inputs the bank address BA, the row address RA, and the column address CA every X clocks (X is an integer equal to or more than 2), and the command generating circuit 3 issues the read command or the write command every X clocks. In this example, it is assumed that X is 2. In addition, it is assumed that an operation cycle (tRC) in the same bank is equal to 8 clocks, that a read access latency (tRL) is equal to 9 clocks, and a write access latency (tWL) is equal to 10 clocks.

When the read command or the write command is issued, the control section 5 selects a selection bank as one of the eight banks based on the bank address BA, and performs the read operation or the write operation to the selection bank according to the row address RA and the column address CA.

When the refresh command is issued, the control section 5 interrupts the read operation or the write operation, selects a target bank based on the bank address, and performs the refresh operation to the target bank.

Figure 4:
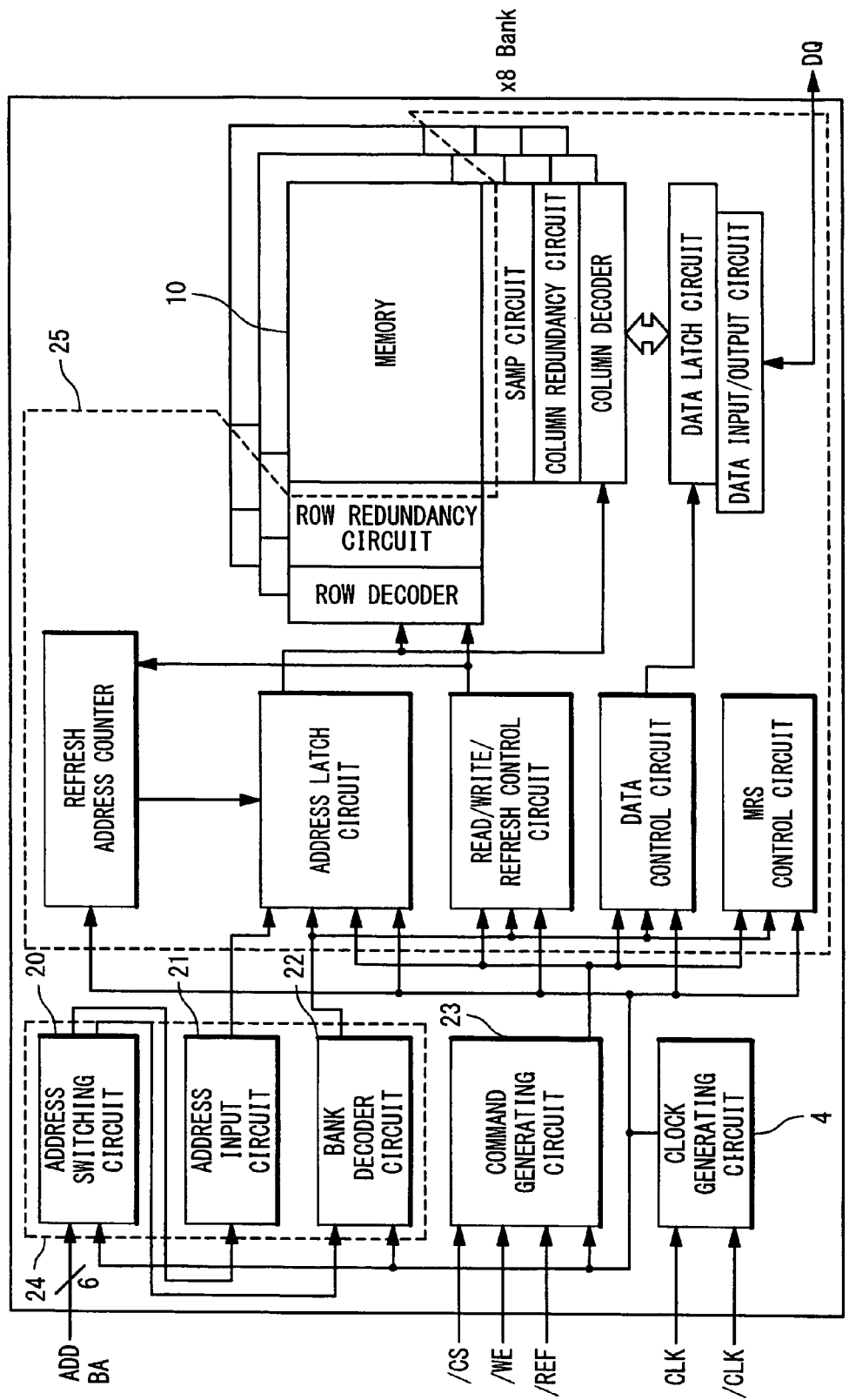
FIG. 4 is a block diagram showing a configuration of a semiconductor memory device according to an embodiment of the present invention.

FIG. 4 is a block diagram showing a configuration of a semiconductor memory device according to an embodiment of the present invention.

The semiconductor memory device according to the embodiment of the present invention includes an address input circuit 21, a bank decoder circuit 22, a command generating circuit 23, and a control section 25, instead of the address input circuit 1, the bank decoder circuit 2, the command generating circuit 3, and the control section 5 in the semiconductor memory device shown in FIG. 1. The semiconductor memory device according to the embodiment of the present invention further includes an address switching circuit 20. The address switching circuit 20, the address input circuit 21, and the bank decoder circuit 22 configure an input section 24.

The clock generating circuit 4 generates an internal clock signal in synchronization with clock signals CLK and /CLK, and outputs the clock signal to the address switching circuit 20, the bank decoder circuit 22, the command generating circuit 23, and the control section 25.

An input signal /CS, an input signal /WE, and an input signal /REF are supplied to the command generating circuit 23. As commands, there are five types of commands that are the NOP command, the READ command, the WRITE command, the REFRESH command, and the MRS command. The command generating circuit 3 issues a command representing any one of the NOP command, the read command, the write command, the refresh command, and the MRS command on the basis of a combination of the input signals /CS, /WE, and /REF.

FIG. 5 is a command truth-value table showing an operation of the semiconductor memory device according to the embodiment of the present invention. Here, a correspondence relation between the input signals /CS, /WE, and /REF and the commands is the same that in the command truth-value table shown in FIG. 2. Accordingly, the description thereof will be omitted.

The address switching circuit 20 is connected to Z external pins.

Figure 6:
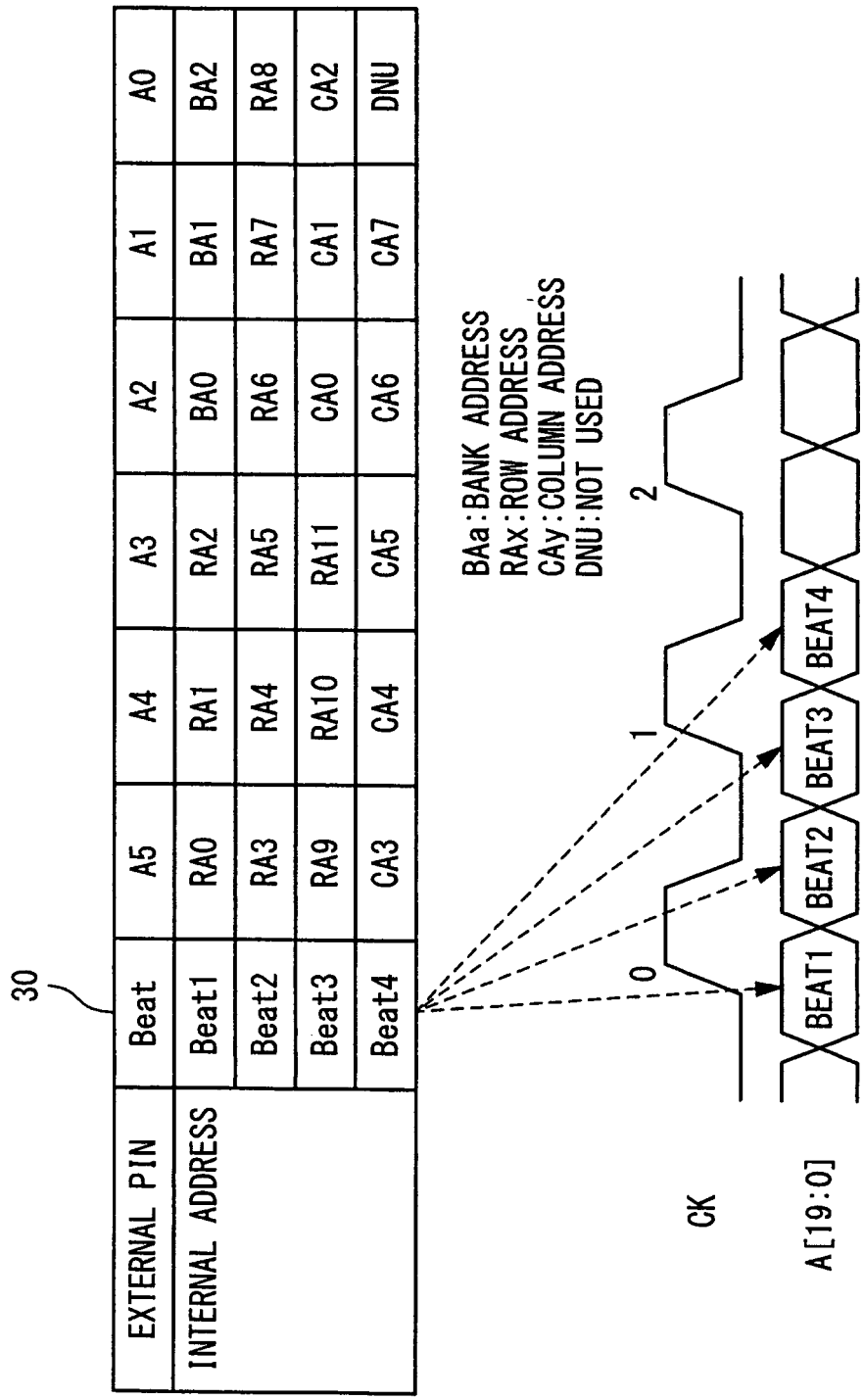
FIG. 6 shows allocation of address pins in the semiconductor memory device according to the embodiment of the present invention.

FIG. 6 shows allocation of the external pins in the semiconductor memory device according to the embodiment of the present invention. The bank address BA, the row address RA, the column address CA are allocated to Y allocation addresses so as to correspond to Z external pins. As described above, the bank address BA, the roe address RA, and the column address CA are L bits, M bits, and N bits, respectively. In addition, the allocation address is Z bits. Here, Y is an integer satisfying $2 \times X$, $Z \geq (L+M+N)/Y$. In this example, L, M, N, and Z are 3, 12, 8, and 2, respectively. In this case, Y is 4 and Z is 6.

As described above, in the semiconductor memory device according to the embodiment of the present invention, the number of external pins is reduced to one-fourth of that of the conventional semiconductor memory device shown in FIG. 1. For this reason, the address switching circuit 20 is required to input four allocation addresses. Accordingly, the address switching circuit 20 needs to know a correspondence relation between the bank address BA, the row address RA, and the column address CA, and the four allocation addresses. The address switching circuit 20 includes a correspondence table 30 shown in FIG. 6.

The correspondence table 30 shows the correspondence relation between the bank address BA, the row address RA, and the column address CA and the four allocation addresses. For example, it is assumed that six external pins are external pins A0 to A5, respectively, the $0^{th}$ to $2^{nd}$ bits of the bank address BA are bits BA0 to BA2, respectively, the $0^{th}$ to $11^{th}$ bits of the row address RA are bits RA0 to RA11, respectively, and that $0^{th}$ to $7^{th}$ bits of the column address CA are bits CA0 to CA7, respectively. In addition, it is assumed that the $1^{st}$ to $4^{th}$ allocation addresses of the four allocation addresses are allocation addresses Beat1, Beat2, Beat3, and Beat4, respectively. In this case, the allocation address Beat1 includes the bits RA0 to RA2 of the row address RA and the bits BA0 to BA2 of the bank address BA allocated to the external pins A5 to A0, respectively. The allocation address Beat2 includes the bits RA3 to RA8 of the row address RA allocated to the external pins A5 to A0, respectively. The allocation address Beat3 includes the bits RA9 to RA11 of the row address RA and the bits CA0 to CA2 of the column address CA allocated to the external pins A5 to A0, respectively. The allocation address Beat4 includes the bits CA3 to CA7 of the column address CA allocated to the external pins A5 to A1, respectively.

The address switching circuit 20 inputs the allocation addresses Beat1, Beat2, Beat3, and Beat4 in accordance with a rising edge and a falling edge of a first internal clock signal (clock signal CK0 in FIG. 6) and a rising edge and a falling edge of a next internal clock signal (clock signal CK1 in FIG. 6). When the allocation addresses Beat1, Beat2, Beat3, and Beat4 are inputted, the address switching circuit 20 refers to the correspondence table 30 and extracts the bank address BA, the row address RA, and the column address CA from the allocation addresses Beat1, Beat2, Beat3, and Beat4. The address switching circuit 20 outputs the column address CA and the row address RA to the address input circuit 21, and outputs the bank address BA to the bank decoder circuit 22.

The address input circuit 21 inputs the address ADD (the column address CA and the row address RA), and outputs the address ADD to the control section 25.

The bank decoder circuit 22 inputs the bank address BA, and outputs the bank address BA to the control section 25 in synchronization with the internal clock signal.

Here, it is assumed that the input section 24 (of the address switching circuit 20, the address input circuit 21, and the bank decoder circuit 22) inputs the bank address BA, the row address RA, and the column address CA every X clocks (X is an integer equal to or more than 2) and that the command generating circuit 23 issues the read command or the write command every X clocks. As described, it is assumed that X is 2. In addition, it is assumed that an operation cycle (tRC) in the same bank is equal to 8 clocks, that a read access latency (tRL) is equal to 9 clocks, and a write access latency (tWL) is equal to 10 clocks.

Generally, in a cycle where the refresh command is generated (issued), the refresh operation is performed after temporarily interrupting the read operation or the write operation. Accordingly, a blank is generated in the bus cycles, and accordingly the bus efficiency cannot be improved. Meanwhile, in the present invention, in order to generate the refresh command with the read operation or the write operation maintained, the refresh command is generated by combining with the read command or the write command.

Figure 7:
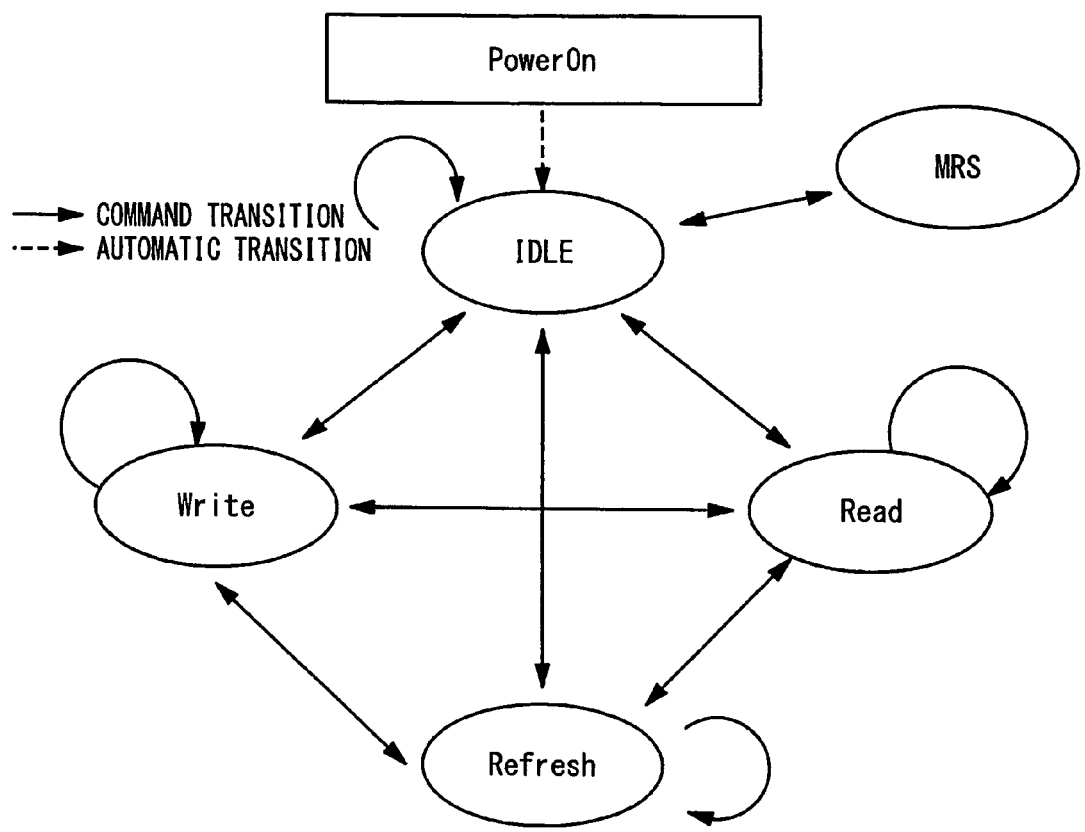
FIG. 7 shows a state transition diagram in the conventional semiconductor memory device.
Figure 8:
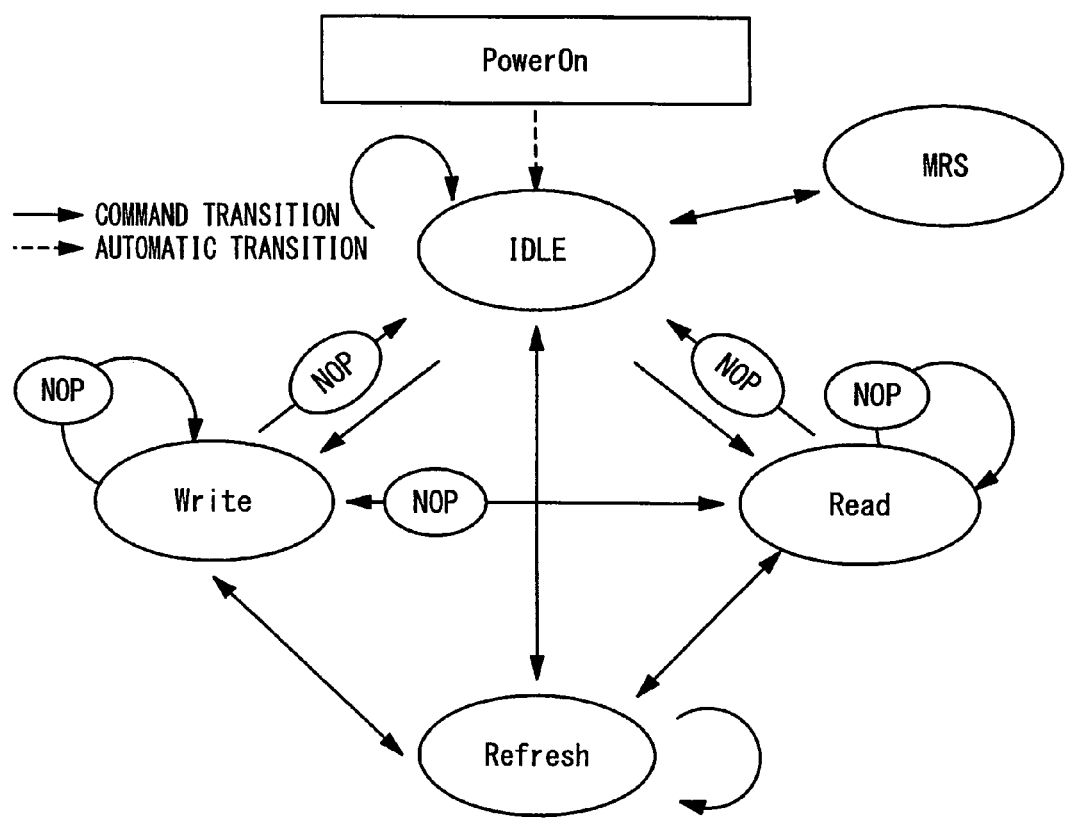
FIG. 8 shows a state transition diagram in the semiconductor memory device according to the embodiment of the present invention.

Specifically, the input section 24 inputs one address (the bank address BA, the row address RA, and the column address CA) in two cycles. Thus, the command generating circuit 23 does not issue the read command or the write command every cycle as show in FIG. 7, but issues the read command or the write command in a first cycle of the two cycles and issues the NOP command in an empty cycle as a second cycle of the two cycles, as show in FIG. 8. The refresh command is generated in the empty cycle. In this case, the input section 24 cannot assign the bank to the refresh command because the inputting of the address is not completed in the first cycle. Thus, it is assumed that the refresh command is executed to the bank assigned when the read command or the write command in a previous cycle was issued (refer to FIGS. 4 and 9). In the present invention, since a burst length is set to four or more and the outputting of data uses two clocks, the data bus cycle is never interrupted during the execution.

Figure 10:
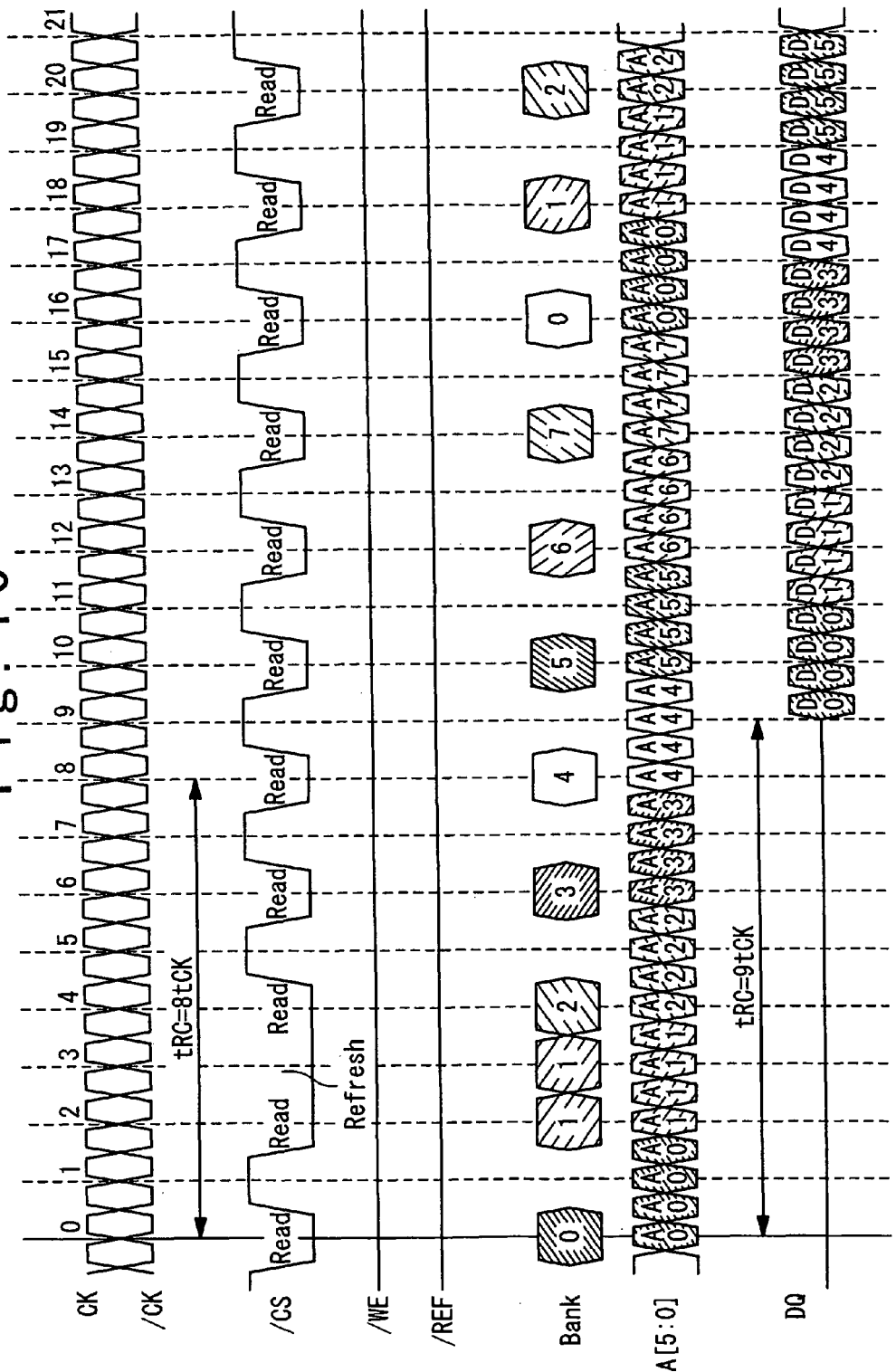
FIG. 10 is a diagram showing timing charts in a multi-bank read operation and a refresh operation as an operation of the semiconductor memory device according to the embodiment of the present invention.

In the command generating circuit 23, a first input signal (/CS=0, /WE=1, and /REF=1) or a second input signal (/CS=0, /WE=0, and /REF=1) is supplied in a first clock of the two clocks (two internal clocks). At this time, the command generating circuit 23 issues the read command or the write command in accordance with the first input signal or the second input signal. For example, as shown in FIG. 10, the read command is issued to the banks "0", "1", "2", "3", "4", "5", "6", "7", and so on in accordance with clocks CK0, CK2, CK4, CK6, CK8, CK10, CK12, CK14, and so on, respectively.

In the command generating circuit 23, a third input signal (/CS=0, /WE=1, and /REF=0) is supplied in a second clock next to the first clock of the two clocks. That is, the third input signal is supplied immediately after the first or second input signal. At this time, the command generating circuit 23 issues the refresh command in accordance with the third input signal immediately after the read command or the write command. For example, as shown in FIG. 10, the refresh command is issued in accordance with the clock CK3.

When the read command or the write is issued, the control section 25 selects a selection bank as one of the eight banks based on the bank address BA, and executes the read operation or the write operation to the selection bank in accordance with the row address RA and the column address CA. For example, as shown in FIG. 10, when the read commands are issued to the banks "0", "1", "2", "3", "4", "5", "6", "7", and so on as the selection banks in accordance with clocks CK0, CK2, CK4, CK6, CK8, CK10, CK12, CK14, and so on, respectively, the read operation is executed to the selection banks "0", "1", "2", "3", "4", "5", "6", "7"; and so on.

When the refresh command is issued immediately after the read command or said write command, the control section 25 executes a refresh operation to the selection bank. For example, as shown in FIG. 10, when the refresh command is issued in accordance with the clock CK3, the refresh operation is executed to the selection bank "1" after the read operation has been executed to the bank "1" as the selection bank.

As one factor that it is difficult to realize high-quality data transfer in a high frequency operation, the bus efficiency is lowered due to a refresh operation, since the refresh operation is performed after temporarily interrupting the read operation or the write operation when the refresh command is issued. Accordingly, according to the semiconductor memory device of the present invention, the refresh command is executed to the selection bank selected when the read command or the write command at a previous cycle is issued. For this reason, the refresh command can be issued with the read operation or the write operation maintained. In this manner, the lowering of the bus efficiency due to the refresh operation can be prevented. Accordingly, the high-quality data transfer in a high frequency operation can be performed.

In addition, as another factor that it is difficult to realize the high-quality data transfer in a high frequency operation, a memory capacity is increased and the number of pins is increased due to extension of the bus width. According to the semiconductor memory device of the present invention, the number of external pins is reduced to 1/Y in comparison with the conventional semiconductor memory device. Accordingly, the number of signal lines arranged on the board can be reduced as much as possible. In this manner, the lowering of the bus efficiency due to the refresh operation can be prevented. Accordingly, the high-quality data transfer in the high frequency operation can be performed.

As the operation of the semiconductor memory device according to the embodiment of the present invention, the read operation will be described in detail.

As shown in FIG. 11A, the command generating circuit 23 issues the read command based on the first input signal (/CS=0, /WE=/RE=1) in the first cycle, and latches the address (of the bank address BA, the row address RA, and the column address CA) at four timings in two cycles of the rising edge and the falling edge in the same cycle and the rising edge and falling edge in the next cycle. In this manner, the control section 25 outputs data $D_{out}$ after the read latency (tRL) in accordance with the read command and the address. In the data output, data of four bursts are outputted consuming two cycles. When the multi-bank operation is performed by continuously issuing the read command to the control section 25, the data output of two cycles can be realized in the address input of two cycles, as shown in FIG. 11B. Thus, the continuous read operation in a high bus transfer rate can be realized.

Next, as the operation of the semiconductor memory device according to the embodiment of the present invention, the write operation will be described in detail.

The command generating circuit 23 issues the write command based on the second input signal (/CS=0, /WE=0, and /RE=1) in the first cycle, and latches the address (of the bank address BA, the row address RA, and the column address CA) at four timings in the same manner as those of the read operation. Thus, the control section 25 can latch data DQ for four bursts in two cycles after the write latency (tWL) in accordance with the write command and the address. Also, the continuous write operation in a high bus transfer rate can be realized to the control section 25.

Next, as the operation of the semiconductor memory device according to the embodiment of the present invention, the refresh operation will be described in detail.

Figure 9:
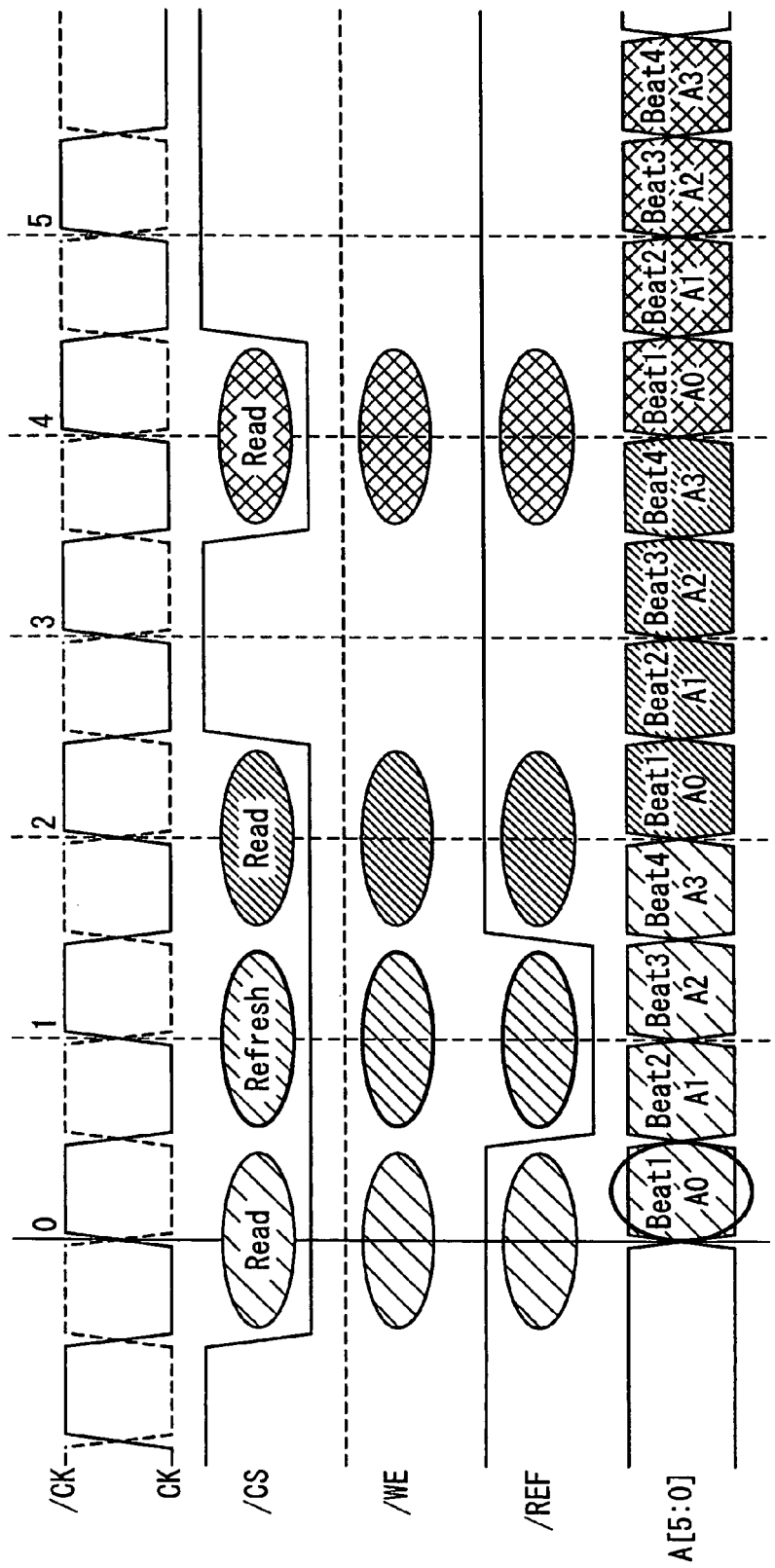
FIG. 9 is a diagram for explaining a refresh command in the semiconductor memory device according to the embodiment of the present invention.
Figure 12:
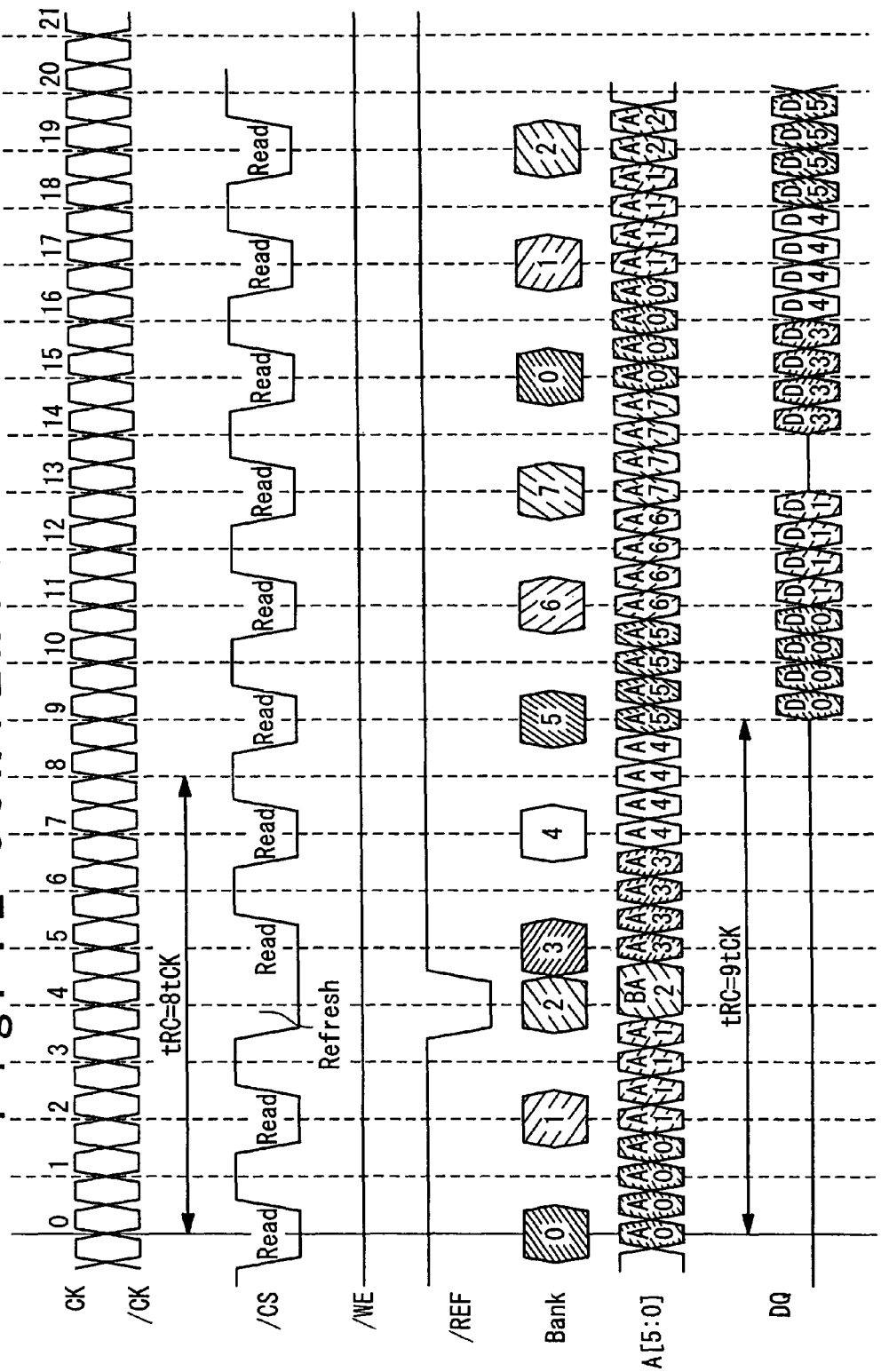
FIG. 12 is a diagram showing timing charts in the multi-bank read operation and the refresh operation as an operation of the conventional semiconductor memory device.

The command generating circuit 23 issues the refresh command based on the third input signal (/CS=0, /WE=1, and /RE=0) in the second cycle. Here, as shown in FIG. 12, the refresh command of the above-mentioned pseudo SRAM has a specification to specify the address of bank in the cycle in which the command has been issued. However, in such a combination, the read operation or the write operation is not performed in the cycle in which the refresh command is issued, and the data transfer is interrupted. Accordingly, not to interrupt the data transfer, the refresh command is interposed between the read commands issued every other cycle as shown in FIG. 9. In this cycle, since the inputting of address of the case where the input section 24 having issued the read command in the previous cycle is not completed, the control section 25 cannot specify the bank address of the refresh address. To compensate it, the bank address of the case where the refresh command is issued directly reflects the bank address specified when the read command was issued in the previous cycle. Accordingly, the refresh command can be issued due to only a logic of the command without individually specifying the bank address of the case where the refresh command is issued.

Next, as the operation of the semiconductor memory device according to the embodiment of the present invention, the read operation and the refresh operation to the issued command will be described.

Figure 13:
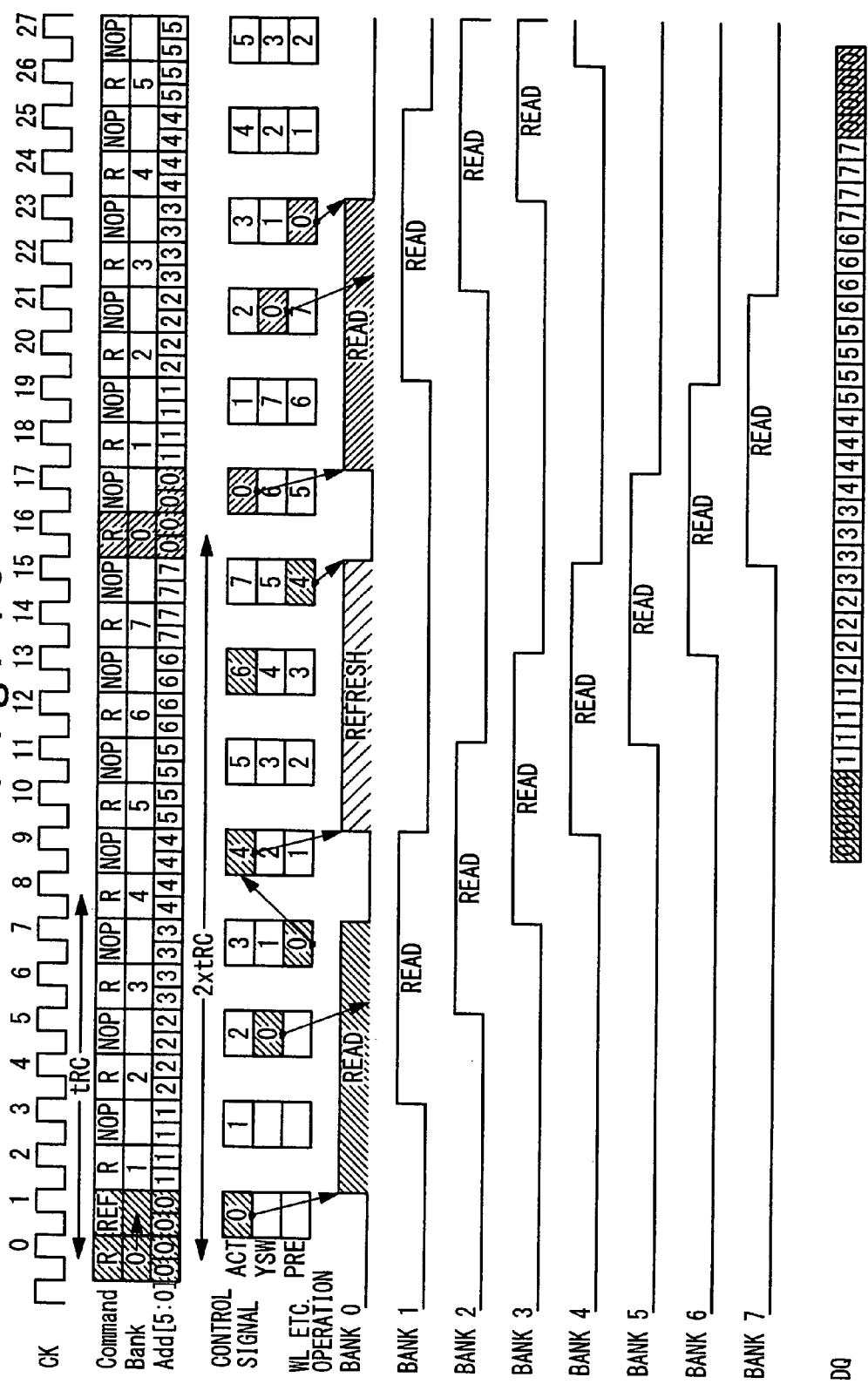
FIG. 13 is a diagram showing timing charts in an internal operation and a read operation during the multi-bank read operation as the operation of the semiconductor memory device according to the embodiment of the present invention.

In the above-mentioned specification of the command issuance, the read command and the refresh command are sequentially issued to the same bank. Meanwhile, as shown in FIG. 13, the control section 25 firstly performs the read operation as the operation of the bank "0", and performs the refresh operation continuously after completing the operation. By retaining the issued refresh command, counting the number of clocks of tRC from the read command, and releasing the refresh command from the clock at which the read operation is completed, the control section 25 can continuously carry out the refresh operation to the same bank.

At first, the control section 25 issues an ACT signal in accordance with a certain clock (the clock CK1 in FIG. 13) by using the read command as a trigger to read one bank (bank "0" in FIG. 12), and activates a word line selected from a plurality of word lines in response to the ACT signal. Next, the control section 25 issues the YSW signal at timing of the clock CK5 that is after four clocks from the clock CK1, reads data by controlling a column circuit in accordance with the YSW signal, and outputs the data to the DQ pads at timing of the clock CK9 that is after four clocks from the clock CK5 (in FIG. 13, the signal of the data bus transfer and the description of timing chart from the YSW signal and the DQ pads are omitted). Moreover, the control section 25 issues a PRE signal to the selected word line at the clock CK7 that is after two clocks from the clock CK5, and completes the read operation by inactivating the selected word line in accordance with the PRE signal. The control section 25 issues the ACT signal to carry out the refresh operation again from the clock CK9 after completion of the above read operation, and activates the word line selected from the plurality of the word lines in response to the ACT signal. The control section 25 only performs the refresh operation of a cell without issuing the YSW signal. Finally, the control section 25 issues the PRE signal from the clock CK15 that is after six clocks from the clock CK9, and completes the refresh operation by inactivating the select word line in accordance with the PRE signal.

In the semiconductor memory device according to the embodiment of the present invention, the operation cycle (tRC) of the same bank is made double because the refresh command is issued at this time. However, the read access time is not delayed. Moreover, even when the tRC is doubled, other banks can be accesses, and accordingly the continuous read operation can be maintained by accessing the other banks until the refresh operation ends. As for the write operation, the refresh operation can be interposed with the continuous write operation maintained, by issuing the refresh command in the same manner. Thus, in the semiconductor memory device according to the embodiment of the present invention, if issuing the refresh command at timing of execution of the multi-bank read operation or write operation, the operation can be continued without lowering the bus efficiency as shown in FIG. 10.

According to the above-mentioned explanation, in the semiconductor memory device according to the embodiment of the present invention, the refresh command is executed to the bank selected when the read command or the write command of the previous cycle is issued. Accordingly, the refresh command can be issued with the read operation or the write operation maintained. In this manner, the lowering of bus efficiency caused by the refresh operation can be prevented. Accordingly, the high-quality data transfer can be realized in the high frequency operation.

In addition, according to the semiconductor memory device of the embodiment of the present invention, the number of external pins is reduced to one-Yth in comparison with the semiconductor memory device shown in the Non-patent literatures 1 and 2. Accordingly, the number of signal lines wired on the board can be reduced as much as possible. In this manner, the deterioration of the bus efficiency caused by the refresh operation can be prevented. Accordingly, the high-quality data transfer in a high frequency operation can be performed.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor memory device comprising:
a memory comprising a plurality of banks;
an input section configured to input an address of a bank address, a row address and a column address;
a command generating circuit configured to issue one of a read command, a write command, and a refresh command based on to an input signal;
a control section configured to select a selection bank from said plurality of banks based on said bank address when said read command or said write command is issued from said command generating circuit, perform a read operation or a write operation on said selection bank based on said row address and said column address, and perform a refresh operation on said selection bank when said refresh command is issued immediately after said read command or said write command,
wherein said command generating circuit issues said read command or said write command based on a first input signal or a second input signal, when said first input signal or second input signal is supplied as said input signal,
wherein said command generating circuit issues said refresh command immediately after said read command or said write command based on a third input signal, when said third input signal is supplied as said input signal immediately after said first input signal or said second input signal,
wherein said input section inputs said address of said bank address, said row address and said column address for every X clocks (X is an integer equal to or greater than 2), and
wherein said command generating circuit issues said read command or said write command based on said first input signal or said second input signal, when said first input signal or said second input signal is supplied in a first clock of said X clocks, and issues said refresh command immediately after said read command or said write command based on a third input signal, when said third input signal is supplied in a clock next to said first clock.

2. The semiconductor memory device according to claim 1, wherein said input section is connected to Z external pins,
wherein said bank address, said row address and said column address are allocated to Y allocation addresses, so as to be adapted for Z external pins, and said bank address, said row address, said column address, said allocation addresses are L bits, M bits, N bits, Z bits, respectively,
wherein L, M, N and Z are positive integers, Y=2*X and Z≧(L+M+N)/Y, and wherein
said input section extracts said bank address, said row address and said column address from Y division addresses to output said control section, when inputting the Y division addresses.

3. The semiconductor memory device according to claim 2, wherein said input section comprises a correspondence table which shows correspondence relation between said bank address, said row address, said column address and said Y allocation addresses, and
wherein said input section refers to said correspondence table to extract said bank address, said row address and said column address from said Y division addresses, when inputting said Y division addresses.

4. The semiconductor memory device according to claim 1, wherein the refresh command is executed to a bank specified when a latest reading command or write command has been issued.

5. The semiconductor memory device according to claim 1, wherein the refresh command is executed to the selection bank immediately after the reading command or the write command has been issued to the selection bank.

6. The semiconductor memory device according to claim 1, wherein said input section is connected to Z external pins,
wherein said bank address, said row address and said column address are allocated to Y allocation addresses, so as to be configured for Z external pins, and said bank address, said row address, said column address, said allocation addresses are L bits, M bits, N bits, Z bits, respectively,
wherein L, M, N and Z are positive integers and X is an integer equal to or greater than 2, Y=2*X and Z≧(L+M+N)/Y, and
wherein said input section extracts said bank address, said row address and said column address from Y division addresses to output said control section, when inputting the Y division addresses.

7. The semiconductor memory device according to claim 1, wherein the control section performs the refresh operation on the selection bank immediately after whenever the read command or write command is performed on the selection bank.

8. The semiconductor memory device according to claim 1, wherein the control section performs a refresh operation on said selection bank when said refresh command is issued immediately after said read command or said write command on said selection bank.

9. A memory access method to a memory having a plurality of banks, comprising:
inputting a bank address, a row address and a column address;
issuing any of a read command, a write command, and a refresh command based on an input signal;
selecting a selection bank from said plurality of banks based on said bank address, when said read command or a said write command is issued;
performing a read operation or a write operation on said selection bank based on said row address and said column address in response to said read command or said write command;
performing a refresh operation on said selection bank when said refresh command is issued immediately after said read command or said write command,
wherein said issuing comprises:
issuing said read command or said write command based on a first input signal or a second input signal when said first input signal or said second input signal is supplied as said input signal; and
issuing said refresh command based on a third input signal immediately after said read command or said write command, when said third input signal is supplied immediately after said first input signal or said second input signal as said input signal,
wherein said inputting comprises:

inputting said bank address, said row address and said column address for every X clocks (X is an integer equal to or more than 2);

said issuing comprises:
  issuing said read command or said write command based on said first or second input signal, when said first or second input signal is supplied in a first clock of said X clocks; and
  issuing said refresh command immediately after said read command or said write command based on a third input signal, when said third input signal is supplied in a clock next to said first clock.

10. The memory access method according to claim 9, wherein said bank address, said row address and said column address are allocated to Y allocation addresses, so as to be adapted for Z external pins, and said bank address, said row address, said column address, said allocation addresses are L bits, M bits, N bits, Z bits, respectively,
  wherein L, M, N and Z are positive integers, Y=2*X and Z≧(L+M+N)/Y, and wherein said input comprises:
  inputting Y division addresses; and
  extracting said bank address, said row address and said column address from said Y division addresses.

11. The memory access method according to claim 10, wherein said extracting
  comprises
    referring to a correspondence table which shows correspondence relation between said bank address, said row address, said column address and said Y allocation addresses, to extract said bank address, said row address and said column address from said Y division addresses, when inputting said Y division addresses.

12. The memory access method according to claim 9, wherein said bank address, said row address and said column address are allocated to Y allocation addresses, so as to be configured for Z external pins, and said bank address, said row address, said column address, said allocation addresses are L bits, M bits, N bits, Z bits, respectively,
  wherein L, M, N and Z are positive integers and X is an integer equal to or greater than 2, Y=2*X and Z≧(L+M+N)/Y, and
  wherein said input comprises:
    inputting Y division addresses; and
    extracting said bank address, said row address and said column address from said Y division addresses.

13. The memory access method according to claim 9, wherein the refresh command is executed to a bank specified when a latest reading command or write command has been issued.

14. The memory access method according to claim 9, wherein the refresh command is executed to the selection bank immediately after the reading command or the write command has been issued to the selection bank.

15. The memory access method according to claim 9, wherein the performing of the refresh operation on said selection bank is whenever said refresh command is issued immediately after said read command or said write command on the selection bank.

16. The memory access method according to claim 9, wherein the performing of the refresh operation on said selection bank is when said refresh command is issued immediately after said read command or said write command on the selection bank.

* * * * *